United States Patent [19]

Miida et al.

[11] Patent Number: 5,115,155
[45] Date of Patent: May 19, 1992

[54] CCD DELAY LINE

[75] Inventors: Takashi Miida; Yoshimitsu Kudoh; Hiedki Mutoh, all of Kanagawa, Japan

[73] Assignee: Fuji Photo Film Co., Ltd., Kanagawa, Japan

[21] Appl. No.: 685,773

[22] Filed: Apr. 16, 1991

[30] Foreign Application Priority Data

Apr. 20, 1990 [JP] Japan .................. 2-103101

[51] Int. Cl.$^5$ .................................. G11C 19/28
[52] U.S. Cl. ................... 307/607; 307/591; 377/57; 377/58; 377/63
[58] Field of Search ............ 307/607, 591; 377/57, 377/58, 63

[56] References Cited
U.S. PATENT DOCUMENTS 4,139,784  2/1979  Sauer ........................... 377/57
4,199,691  4/1980  Angle ........................... 307/607
4,725,748  2/1988  Hayes et al. ................. 307/607
4,951,302  8/1990  Peter et al. .................. 307/607
5,029,189  7/1991  Sato et al. .................... 377/58

Primary Examiner—Stanley D. Miller
Assistant Examiner—Scott A. Ouellette
Attorney, Agent, or Firm—Sughrue, Mion, Zinn Macpeak & Seas

[57] ABSTRACT

A charge-coupled device (CCD) delay line having a temperature compensation circuit capable of compensating for temperature variations for providing an accurate and consistent delay of an input signal. The temperature compensation circuit includes first and second registers for transferring charges, and a sample-and-hold circuit connected between outputs of each register and two inputs of a differential amplifier. The differential amplifier supplies a signal which corresponds to temperature variations to properly bias the input signal.

5 Claims, 6 Drawing Sheets

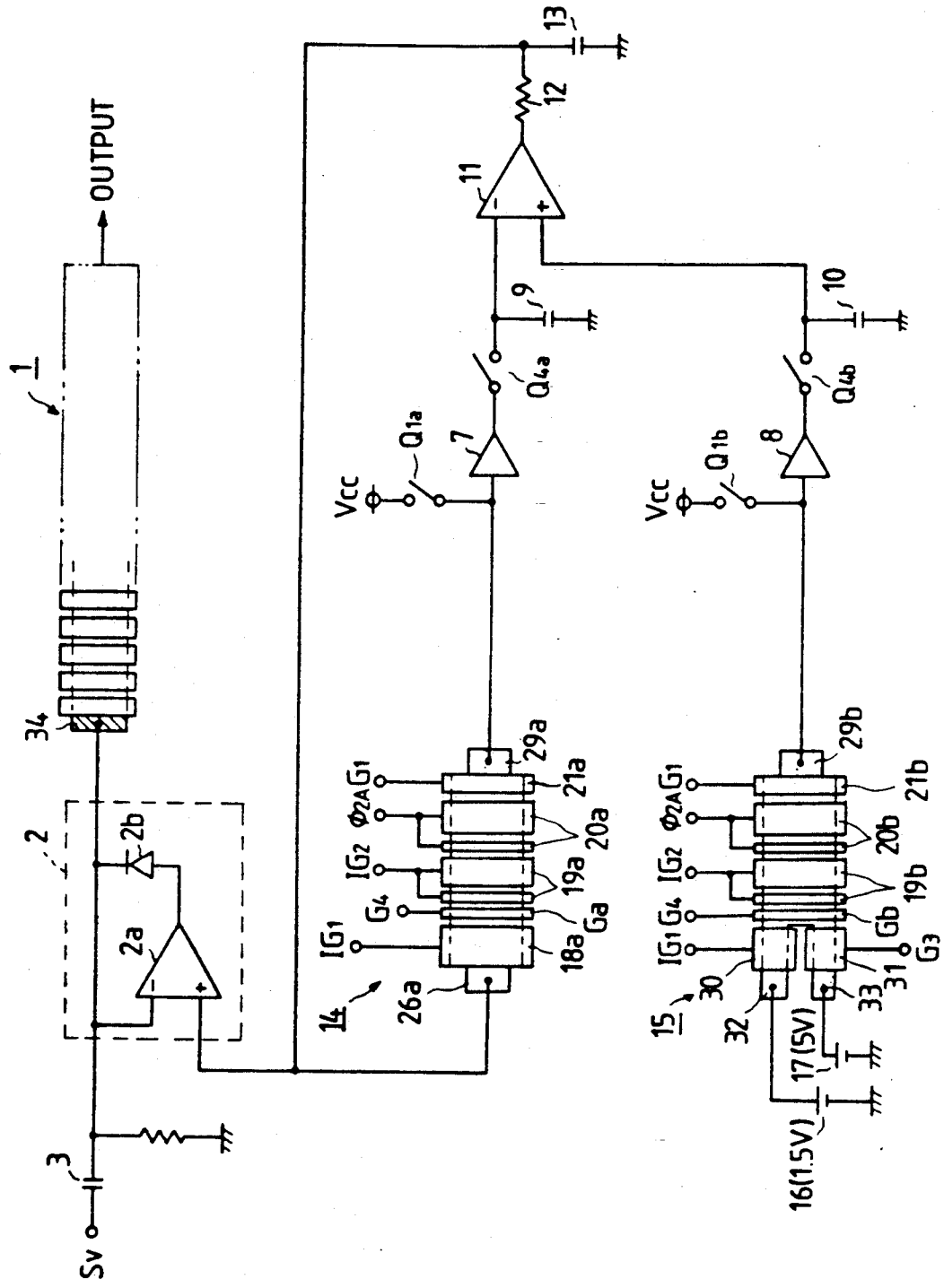

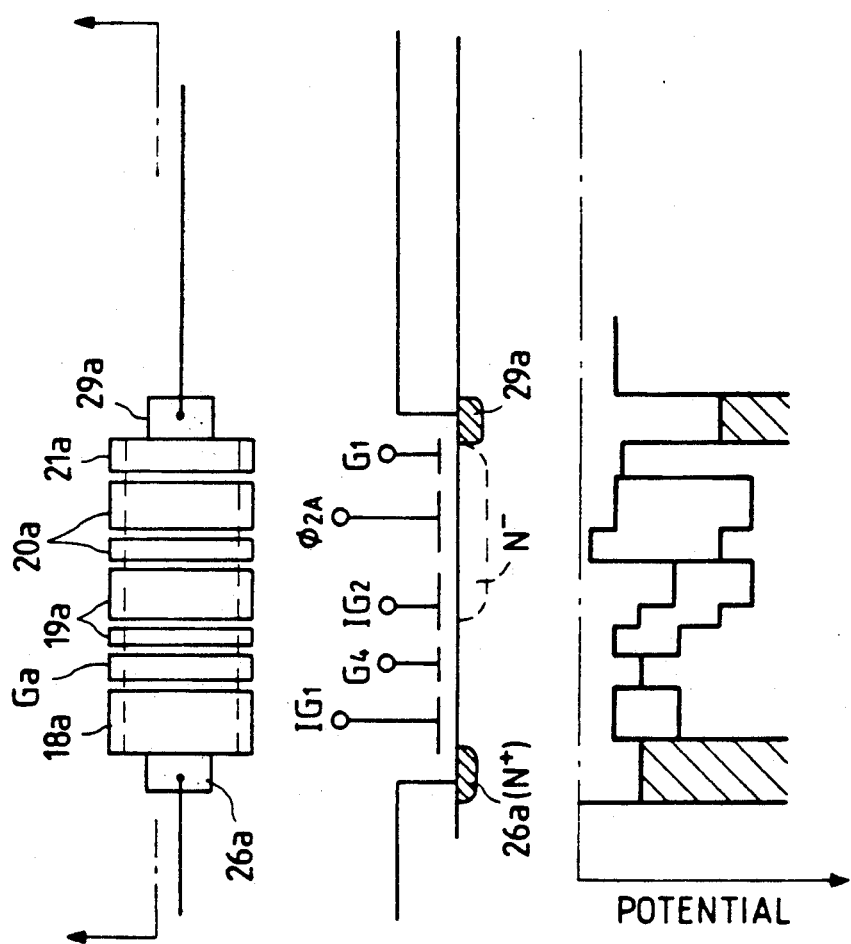

CCD DELAY LINE

FIELD OF THE INVENTION

The present invention relates to a charge-coupled device (CCD) delay line used in, for example, video signal processing, and more particularly to a CCD delay line having a temperature compensation circuit capable of compensating for temperature variations so as to accurately and reliably delay an input signal.

BACKGROUND OF THE INVENTION

The accuracy in delay of CCD delay lines have a strong effect in image quality, and it is for this reason that high-performance CCD delay lines have long been desired. Excellently performing CCD delay lines exhibit characteristics such that an input signal is accurately delayed and outputted without being distorted or varied.

To achieve efficient transfer and high dynamic range, a CCD delay line transfers an input signal by adding an appropriate offset (sometimes called "priming"). However, the offset is easily affected by changes in ambient temperature, causing both distortion and delay variations in the delayed signal.

RELATED APPLICATION

A CCD delay line for video signal processing and which is free of the above problem has been proposed in U.S patent application No. 07/398,870 filed on Aug. 25, 1989 by the same inventors. The proposed CCD delay line, which is in the form of a semiconductor chip and is manufactured using semiconductor fabrication technology, has a structure as shown in FIG. 9.

Referring to FIG. 9, reference numeral 1 designates a CCD delay line body composed of buried CCDs (BCCDs), which delay a signal by propagating signal charges through the delay line in synchronism with a transfer drive signal having a predetermined frequency. Reference numeral 2 designates an input clamping circuit, serving as an input bias adjusting means. This circuit clamps the bias level of an input video signal $S_v$ in response to a synchronizing signal incorporated in the video signal $S_v$ which is received through a capacitive element 3. The video signal $S_v$ is then supplied to the delay line body 1 with an optimal offset added to the video signal $S_v$.

In addition, the input clamping circuit 2 is connected to a temperature compensation circuit which includes a first register 14, a second register 15, and a differential amplifier 11.

The first register 14 is composed of buried CCDs (BCCDs) having an N+-type impurity layer 26a serving as a sync tip bias point at one end and a floating diffusion layer 29a made of an N+-type impurity layer formed at another end of the first register. The first register transfers a signal charge introduced from the N+-type impurity layer 26a to the floating diffusion layer 29a in synchronism with drive signals $IG_1$, $IG_2$, $\phi_{2A}$, $G_1$, $G_2$, $\phi_{1A}$, $\phi_{2B}$, and OG respectively applied to gate electrodes 18a, 19a, 20a, 21a, 22a, 23a, 24a, and 25a, at predetermined intervals. Reference numerals 27a and 28a designate N+-type impurity layers buried along the transfer path.

The second register 15 has the same structure as the first register 14 except for its input section. The input section, which has a first gate electrode 30 and a second gate electrode 31 disposed between N+-type impurity layers 32 and 33 and an N+-type impurity layer 27b, turns on and off in synchronism wit drive signals $IG_1$ and $G_3$. The N+-type impurity layers 32 and 33 serve as two sync tip bias points. The input section transfers a signal charge to a floating diffusion 29b made of an N+-type impurity formed at an end of the second register in synchronism with drive signals $IG_2$, $\phi_{2A}$, $G_1$, $G_2$, $\phi_{1A}$, $\phi_{2B}$, and OG respectively applied to gate electrodes 19b, 20b, 21b, 22b, 23b, 24b, and 25b at predetermined intervals. These gate electrodes 19b to 25b extend to one side of the N+-type impurity layer 27b. Reference number 28b designates an N+-type impurity layer disposed between the gate electrodes 21b and 22b along the transfer path of the second register.

The N+-type impurity layer 26a of the first register 14 is connected to the non-inverting input of a differential amplifier 2a, while the N+-type impurity layers 32 and 33 of the second register 15 are connected to constant voltage sources 16 and 17, respectively.

The floating diffusion layer 29a of the first register 14 is reset to a power voltage $V_{cc}$ when a switching transistor $Q_{1a}$ is turned on in synchronism with a reset signal RST. A signal generated at the floating diffusion layer 29a is transferred, via a buffer amplifier 7, to a switching transistor $Q_{4a}$ and capacitive element 9, which constitute a sample-and-hold circuit. A signal appearing at the capacitive element 9 is also supplied to the inverting input of the differential amplifier 11.

The floating diffusion layer 29b of the second register 15 is connected to a switching transistor $Q_{1b}$ that is connected to the power voltage $V_{cc}$, and also to a switching transistor $Q_{4b}$ and capacitive element 10, which constitute a sample-and-hold circuit, through a buffer amplifier 8. A signal appearing at the capacitive element 10 is supplied to the non-inverting input of the differential amplifier 11.

The output of the differential amplifier 11 is fed back to the N+-type impurity layer 26a of the first register 14 through a low-pass filter constituted by a resistor 12 and capacitive element 13.

A clamping diode 2b is inserted between the inverting input and output of the differential amplifier 2a of the clamping circuit 2, while the inverting input is connected to the output of the capacitive element 3.

With reference to the timing chart shown in FIG. 10, operation of the example will be described.

Each of the floating diffusion layers 29a and 29b of the first and second registers 14 and 15 is reset to the potential $V_{cc}$ in synchronism with the reset signal RST generated at a predetermined cycle $\tau$. The cycle $\tau$ is the period required for transferring a signal charge one stage toward the output. Signal charges are sequentially transferred to the output by repeating this operation at each cycle $\tau$.

When a gate signal $IG_1$, which is asserted high (i.e., 5 volts) at time $t_1$, is applied to the gate electrode 18a, the first register 14 stores and transfers a charge $q_a$ toward the output. The charge $q_a$ corresponds to an applied voltage $\Delta q$ of the N+-type impurity layer 26a at the N+-type impurity layer 27a.

In the second register 15, the N+-type impurity layers 32 and 33 are respectively connected to a 3 volt and 5 volt dc power sources 16 and 17, respectively. When the gate signal $IG_1$, is asserted high and applied to the gate electrode 30 at time $t_1$, the second register 15 causes a difference to occur between the potential below the N+-type impurity layer 32 and the potential below the gate electrode 30 so that a charge $q_1$ corresponding to the difference is introduced from the N+-type impurity layer 32 to the N+-type impurity layer 27b. By causing the gate electrode 30 to return to a low level, the second register 15 stores below the N+-type impurity layer 27b the charge $q_1$ corresponding to the difference between the potential levels below the N+-type impurity layers 32 and 27b. Then, when a gate signal $G_3$ is asserted high (i.e., 3 V) at time $t_2$, and applied to the gate electrode 31, the potential level below the gate electrode 31 will be increased. As a result, a part $q_2$ of the charge $q_1$ below the N+-type impurity layer 27b overflows to the N+-type impurity layer 33 while the remaining charge $q_b$ (where $q_b = q_1 - q_2$) is maintained below the N+-type impurity layer 27b. Thus, the charge $q_b$ that corresponds to the difference between the potential levels below the gate electrode 31 and the N+-type impurity layer 27b is measured.

The first and second registers 14 and 15 transfer the signal charges $q_a$ and $q_b$ one stage at a time toward the output. Upon reaching the floating diffusion layers 29a and 29b, the signal charges $q_a$ and $q_b$ are respectively sampled at the transistors $Q_{4a}$ and $Q_{4b}$ and respectively held by the capacitive elements 9 and 10. The charges $q_a$ and $q_b$ are then supplied to the inputs of the differential amplifier 11. The differential amplifier 11 produces a difference signal $\Delta q$ which is fed back to the first register 14. The difference signal $\Delta q$ corresponds to the difference between the charges $q_a$ and $q_b$.

Accordingly, the above-described CCD delay line generates a difference signal that follows temperature variations by transferring the signal charges measured at the respective input sections of the first and second registers 14 and 15 under the same conditions and feeding back the difference signal corresponding to the difference between the amount of signal charge to the first register. The difference signal, in turn, controls the clamp circuit to optimally bias the video signal $S_v$, thus compensating for temperature variations.

However, although such a CCD delay line measures the signal charge $q_b$ which is a prescribed value at the N+-type impurity layer 27b of the second register 15 and maintains the measured value, when the N+-type impurity layer 27b is in a floating state, it is subject to stray capacitance. As a result, measurement errors are caused by voltage variations in the N+-type impurity layer 27b and the prescribed signal charge cannot be accurately generated.

SUMMARY OF THE INVENTION

It is therefore an object of the present invention to provide a CCD delay line having an input section that is capable of accurately measuring signal charges which are introduced to first and second registers of a temperature compensation circuit free of the above-mentioned problems.

The above and other objects of the invention are accomplished by a CCD delay line having an buried CCD delay line body, an input bias adjusting means for clamping a signal to be delayed and supplying the clamped signal to the delay line body, a first register having a transfer path made of an buried CCD, which buried CCD has the same structure as the delay line body, a second register having a transfer path made of an buried CCD, which buried CCD has the same structure as the delay line body and the first register, first means for detecting an amount of charge applied from the first register, second means for detecting an amount of charge applied from the second register, and means for controlling a bias adjustment amount of the input bias adjusting means in accordance with a difference between the amount of charge detected by the first and second charge amount detection means and applying a voltage corresponding to the difference to an input contact of the first register.

In such a CCD delay line, an input section of the second register includes: a first diffusion layer which is set to a first predetermined potential, a second diffusion layer which is set to a second predetermined potential, the second potential being higher than the first potential, a measuring gate electrode which is set to an intermediate potential between the first and second potentials and which is connected to a charge transfer path, a first gate electrode which is disposed between the first diffusion layer and the measuring gate electrode, a second gate electrode which is disposed between the second diffusion layer and the measuring gate electrode. The CCD delay line measures the transferred charge by applying a control signal of a predetermined voltage at predetermined timing to the first gate electrode and applying a constant voltage to the second gate electrode so that a charge corresponding to a difference between a potential below the second gate electrode and a potential below the measuring gate electrode is generated below the measuring gate electrode.

According to the thus constructed CCD delay line of the invention, the charge introduced to the input section of each register is measured by the difference between the potential wells generated below the gate electrodes. As a result, no potential level variation attributable to capacitive coupling between the impurity layers when in a floating state is caused as in the conventional example. Thus, the amount of signal charge can be measured at all times, and a reliable temperature compensation circuit is achieved.

Other features and advantages of the invention will be apparent from the following description of the preferred embodiments, and from the claims.

BRIEF DESCRIPTION OF THE DRAWINGS

FIG. 1 is a block diagram showing an embodiment of the invention;

FIGS. 2A, 2B, and 2C are sectional views showing main portions of the embodiment shown in FIG. 1;

DESCRIPTION OF THE PREFERRED EMBODIMENTS

A CCD delay line in accordance with a preferred embodiment of the invention will be described with reference to the accompanying drawings.

Figure 9:
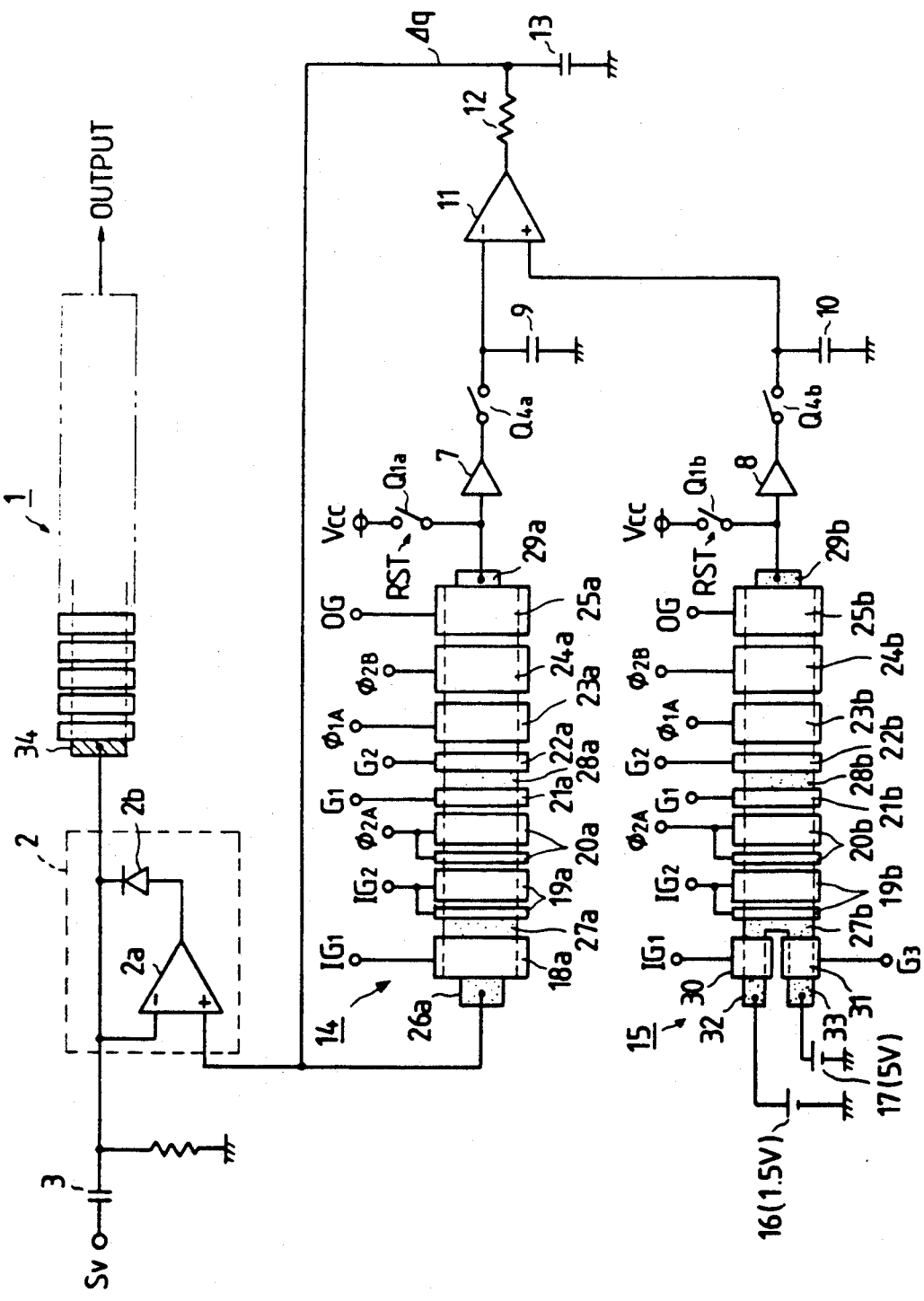
FIG. 9 is a block diagram showing a conventional example.

FIG. 1 is a block diagram showing the embodiment of the invention, in which the same reference numerals as in FIG. 9 designate the same or similar components. Accordingly, the same or similar components will only be further described, if necessary, to more clearly present the subject matter.

Referring to FIG. 1, a measuring gate electrode Ga is formed between gate electrodes 18a and 19a provided at the input section of a first register 14, while a measuring gate electrode Gb is formed between gate electrodes 30 and 31 and gate electrode 19b provided at the input section of a second register 15. A constant voltage $G_4$ of 4 volts is applied to both gate electrodes Ga and Gb. And, a constant voltage $G_3$ of 3 volts is applied to the gate electrode 31. In this embodiment, gate electrodes 22a to 25a, and 22b to 25b, and the impurity layers 28a and 28b are not required.

With respect to FIGS. 2A, 2B, and 2C, the first register 14 has gate electrodes 18a, Ga, and 19a to 21a arranged in the longitudinal direction. The buried CCDs are arranged by forming the $N^+$-type impurity layer 26a (serving as a sync tip bias point), a floating diffusion layer 29a at its tail end, and an $N^-$-type impurity layer between the gate electrode 19a and the $N^+$-type impurity layer 29a.

The first register 14 transfers a signal charge from the $N^+$-type impurity layer 26a to the floating diffusion layer 29a in synchronism with control signals $IG_1$, $G_4$, $IG_2$, $\phi_{24}$ and $G_1$, each having a predetermined level and applied at a predetermined cycle.

Figures 3A, 3B, 3C:
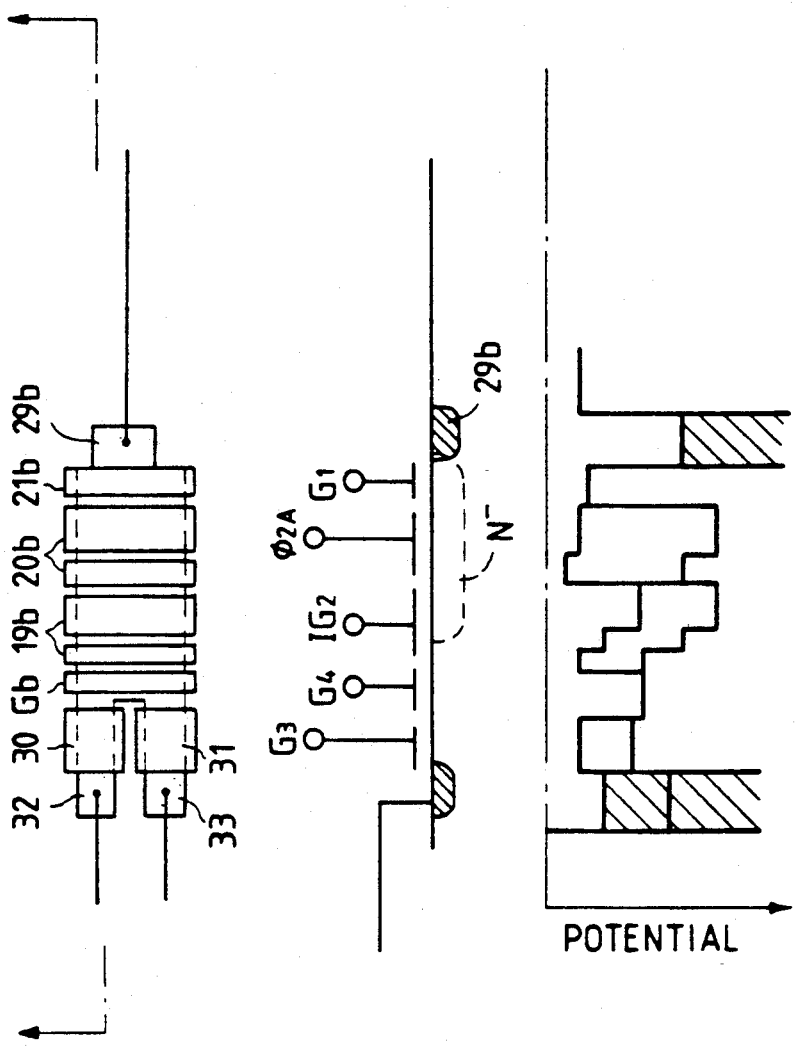
FIGS. 3A, 3B, and 3C are sectional views showing main portions of the embodiment shown in FIG. 1.

As shown in FIGS. 3A, 3B, and 3C, the second register 15 has the same structure as the first register 14 except for its input section. The gate electrodes Gb and 19b to 21b respectively correspond to the gate electrodes Ga and 19a to 21a, while the $N^+$-type impurity layer 29b corresponds to the $N^+$-type impurity layer 29a. The control signals $IG_1$, $G_4$, $IG_2$, $\phi_{24}$, and $G_1$ are commonly applied to both registers. At the gate electrode 31, the constant D.C. voltage $G_3$ of 3 volts is applied at all times.

An operation of the CCD delay line having a structure as just described will now be explained with reference to potential profiles illustrated in FIGS. 4 to 7. Timing of the control signals $IG_1$, $IG_2$ and $\phi_{24}$ is shown in FIG. 8.

Figure 8:
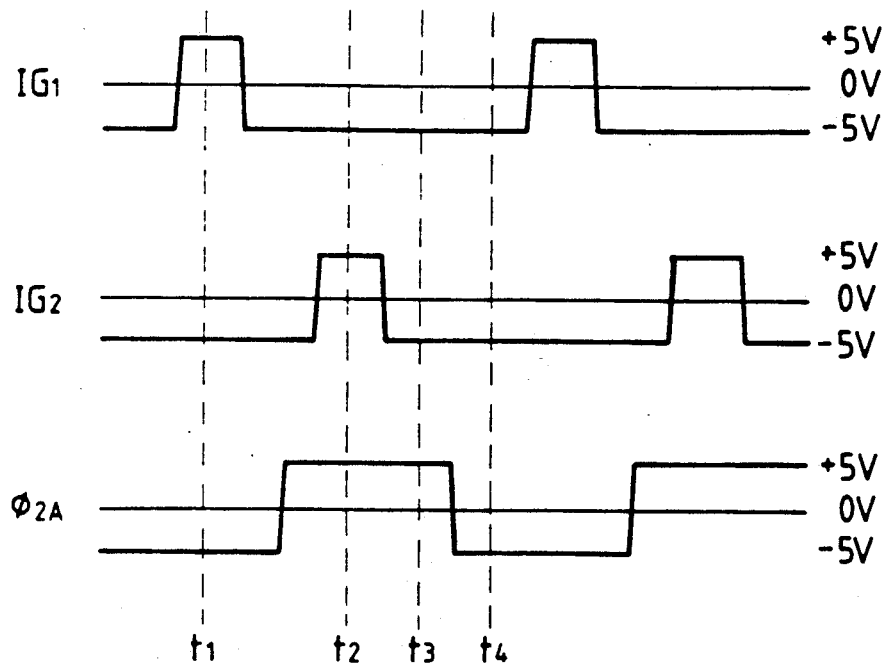
FIG. 8 is a timing chart of drive signals for the embodiment of the present invention.
Figure 10:
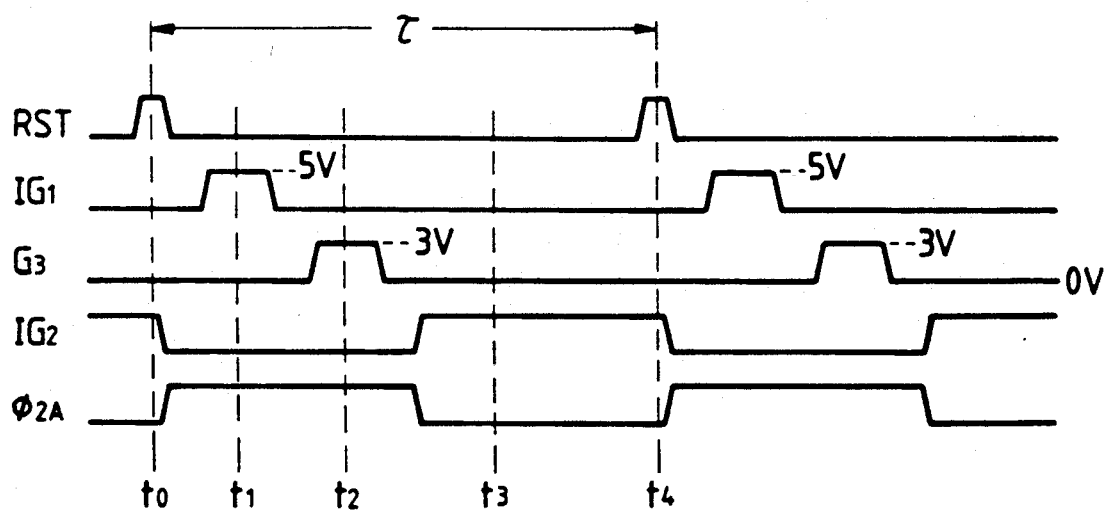
FIG. 10 is a timing chart of drive signals for the conventional example.

In operation, the first register 14, which is used as a reference register, transfers a charge in synchronism with the timing shown in FIG. 8. The second register 15 likewise transfers a charge, and repetitively measures a signal charge by setting a bias point at the time the charge is at the sync tip.

Figure 4:
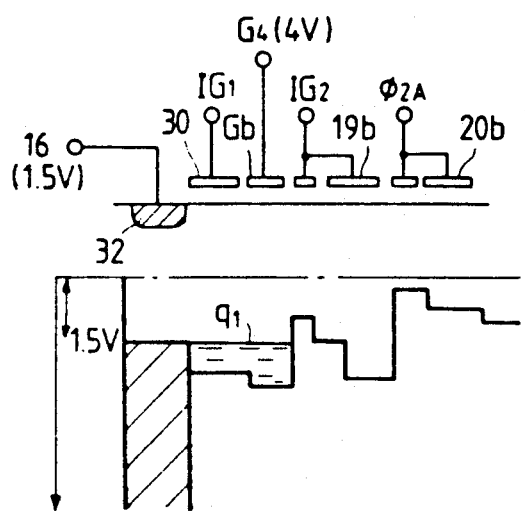
FIGS. 4 to 7 are diagrams showing potential profiles.
Figure 5:
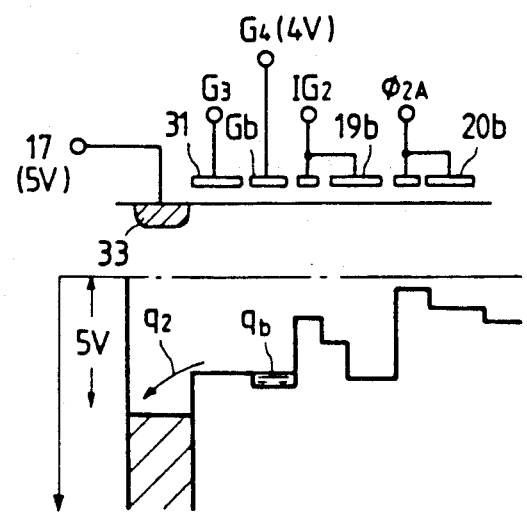

That is, in the second register 15, when the control signals $IG_1$, $IG_2$, and $\phi_{24}$ are respectively asserted high($+5$ V), low($-5$ V), and low($-5$ V) at time $t_1$ (see FIG. 8), the potential level below the gate electrode 30 becomes lower than the potential level below the impurity layer 32 which is set to 1.5 V, as shown in FIG. 4. As a result, the charge is introduced from the impurity layer 32 to the potential well below the gate electrode Gb. At this time, the control signal $IG_2$ is low, the gate electrode 19b serves as potential barriers. Since the constant voltage $G_3$ of 3 volts is applied, a part $q_2$ of the charge $q_1$ introduced from the impurity layer 32 overflows to the impurity layer 33. When the control signal $IG_1$ becomes low, the gate electrode 30 serves as a potential barrier, and thus interrupts the passage of any charge between the impurity layer 33 and the potential well below the gate electrode Gb. As a result, a signal charge $q_b$ corresponding to electrode 31 and the potential well below the gate electrode Gb is stored at the potential well below the gate electrode Gb. That is, with reference to FIGS. 5A and 5B, the charge $q_b$ equals the difference $q_1 - q_2$, which is proportional to the difference between the voltages applied to the gate electrodes 31 and Gb (i.e., $4 - 3 = 1$ V). The measurement of the prescribed amount of charge is thus completed.

Figure 6:
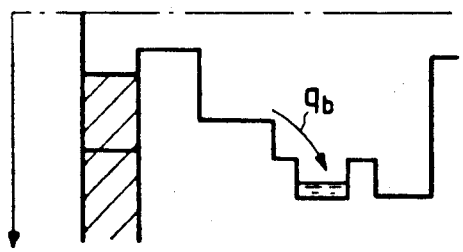

When the control signals $IG_1$, $IG_2$, and $\phi_{24}$ are respectively asserted low($-5$ V), high($+5$ V), and high($+5$ V), at time $t_2$, the potential level below the gate electrode 19b becomes lower, so that the signal charge $q_b$ is transferred to below the gate electrode 19b as shown in FIG. 6.

Figure 7:
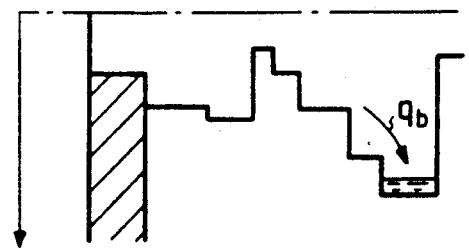

Then, when the control signals $IG_1$, $IG_2$, and $\phi_{24}$ are respectively asserted low($-5$ V), low($-5$ V), and high($+5$ V), at time $t_3$, the potential level below the gate electrode 19b increases, so that the signal charge $q_b$ is further transferred to below the gate electrode 20b as shown in FIG. 7.

Then, at time $t_4$, the potential level below the gate electrode 20 increases, so that the signal charge $q_b$ is transferred to next stage.

By repeating the operation of introducing the prescribed charges $q_a$ and $q_b$ from the input sections of the registers 14 and 15, and sequentially transferring the charges toward the outputs, a signal charge representative of the difference between the charges having reached the floating diffusion layers 29a and 29b is detected by the differential amplifier 11 and fed back with a difference signal $\Delta q$ while automatically controlling the clamping circuit 2.

As described above, the signal charge $q_b$ corresponding to the difference between the potential level below the gate electrode 31 and the potential level of the potential well below the gate electrode Gb can be maintained constant at all times even if there are variations in fabricating processes or temperature. As a result, the ratio of a maximum transferrable charge $q_b$ of the second register 15 to a maximum transferrable charge $q_a$ of the first register 14 (i.e., the reference register) can be maintained constant at all times. Therefore, the bias control of the delay line body can be accurately applied.

As described in the foregoing, the signal charges introduced to the input sections of the respective registers in the temperature compensation circuit are measured taking advantage of the difference between the potential levels of the potential wells below the gate electrodes. As a result, there is no variation in potential level attributable to capacitance coupling as in the conventional example. Moreover, the prescribed signal charge can be measured at all times and thus a more highly reliable temperature compensation circuit can be achieved.

What is claimed is:

1. A charge-coupled device (CCD) delay line comprising: a delay line circuit, said delay line circuit comprising a plurality of buried CCDs; input bias adjusting means for clamping a signal to be delayed and supplying said clamped signal to said delay line circuit; a first register having a transfer path comprising a plurality of buried CCDs of the same structure as said delay line circuit; a second register having a transfer path comprising a plurality of buried CCDs of the same structure as said delay line circuit and said first register; first means for detecting an amount of charge applied from said first register; second means for detecting an amount of charge applied from said second register; bias means for controlling a bias adjustment amount of said input bias adjusting means in accordance with a charge representative of a difference between said amounts of charge detected by said first and second charge amount detection means and applying a voltage corresponding to said difference to an input contact of said first register;

wherein an input section of said second register comprises: a first diffusion layer having a first predetermined potential applied thereto; a second diffusion layer having a second predetermined potential applied thereto, said second potential being higher than said first potential; a measuring gate electrode having an intermediate potential applied thereto and being connected to a charge transfer path, said intermediate potential being between said first and second potentials; a first gate electrode being disposed between said first diffusion layer and said measuring gate electrode; and a second gate electrode being disposed between said second diffusion layer and said measuring gate electrode; said CCD delay line measuring transferred charge by applying a control signal of a predetermined voltage at predetermined timing to said first gate electrode and applying a constant voltage to said second gate electrode so that a charge corresponding to a difference between a potential below said second gate electrode and a potential below said measuring gate electrode is generated below said measuring gate electrode.

2. The CCD delay line as claimed in claim 1, wherein said input bias means comprises: an operational amplifier having a clamping diode connected between an output and inverting input of said operational amplifier, a non-inverting input of said operational amplifier being connected to an input of said first register and an output of said bias means.

3. The CCD delay line as claimed in claim 1, wherein said first means comprises: an output buffer; a switching transistor having an input connected to an output of said output buffer; and a capacitor having one terminal grounded and a second terminal connected to an output of said switching transistor and to an inverting input of said bias means.

4. The CCD delay line as claimed in claim 1, wherein said second means comprises: an output buffer; a switching transistor having an input connected to an output of said output buffer; and a capacitor having one terminal grounded and a second terminal connected to an output of said switching transistor and to a non-inverting input of said bias means.

5. The CCD delay line as claimed in claim 1, wherein said bias means comprises: an operational amplifier having an inverting input connected to an output of said first means and a non-inverting input connected to an output of said second means; and a low-pass filter connected between an output of said operational amplifier and an input of said first register.

* * * * *